United States Patent [19]
Bennett et al.

[11] Patent Number: 5,851,664
[45] Date of Patent: Dec. 22, 1998

[54] SEMICONDUCTOR WAFER PROCESSING ADHESIVES AND TAPES

[75] Inventors: Richard E. Bennett, Hudson, Wis.; Gerald C. Bird, Woodbury, Minn.; Mark K. Nestegard, Woodbury, Minn.; Eleanor Rudin, St. Paul, Minn.

[73] Assignee: Minnesota Mining and Manufacturing Company, St. Paul, Minn.

[21] Appl. No.: 868,143

[22] Filed: Jun. 3, 1997

Related U.S. Application Data

[63] Continuation-in-part of Ser. No. 499,896, Jul. 11, 1995, abandoned.

[51] Int. Cl.$^6$ ..................................................... B32B 7/12
[52] U.S. Cl. ................................... 428/355 BL; 428/343; 428/356; 525/89
[58] Field of Search ........................... 428/355 BL, 40.1, 428/343, 345, 356, 355 R; 525/89, 90, 94

[56] References Cited

U.S. PATENT DOCUMENTS

| | | | |
|---|---|---|---|
| 3,281,383 | 10/1966 | Zelinski et al. ........................ | 260/23.7 |
| 3,837,994 | 9/1974 | Flanagan et al. . | |
| 4,028,292 | 6/1977 | Korpman ............................... | 260/27 R |
| 4,080,348 | 3/1978 | Korpman .............................. | 260/27 BB |
| 4,136,071 | 1/1979 | Korpman .............................. | 260/27 BB |
| 4,166,706 | 9/1979 | Korpman .............................. | 400/696 |
| 4,662,874 | 5/1987 | Korpman ............................... | 604/370 |
| 4,797,322 | 1/1989 | Huddleston et al. ............. | 428/355 BL |
| 4,818,621 | 4/1989 | Kuroda et al. ...................... | 428/424.6 |
| 4,822,653 | 4/1989 | Kauffman et al. ................ | 428/355 BL |
| 4,853,286 | 8/1989 | Narimatsu et al. ..................... | 428/343 |
| 4,968,559 | 11/1990 | Kuroda et al. ........................... | 428/354 |
| 5,085,655 | 2/1992 | Mann et al. ............................. | 604/389 |
| 5,126,178 | 6/1992 | Takemura et al. ........................ | 428/40 |
| 5,143,968 | 9/1992 | Diehl et al. ........................ | 428/355 BL |
| 5,183,699 | 2/1993 | Takemura et al. ...................... | 428/214 |
| 5,274,036 | 12/1993 | Korpman et al. .......................... | 525/92 |
| 5,403,658 | 4/1995 | Southwick et al. ............... | 428/355 BL |

FOREIGN PATENT DOCUMENTS

| | | |
|---|---|---|
| 0 157 508 A2 | 10/1985 | European Pat. Off. . |
| 0 252 739 B1 | 1/1988 | European Pat. Off. . |
| 0 520 515 A2 | 12/1992 | European Pat. Off. . |
| 0 530 729 A1 | 3/1993 | European Pat. Off. . |
| 0 588 180 A1 | 3/1994 | European Pat. Off. . |
| 62-58638 | 3/1987 | Japan . |
| 62-66825 | 3/1987 | Japan . |
| 62-121781 | 6/1987 | Japan . |
| 2-269672 | 11/1990 | Japan . |
| 5-230426 | 9/1993 | Japan . |
| 6-136186 | 5/1994 | Japan . |
| 7-019232 | 1/1995 | Japan . |
| WO 95/10576 | 4/1995 | WIPO . |
| WO 97/03461 | 1/1997 | WIPO ............................ H01L 21/68 |

*Primary Examiner*—Daniel Zirker
*Attorney, Agent, or Firm*—Doreen S. L. Gwin

[57] ABSTRACT

A semiconductor wafer processing tape comprises a permanent backing and a layer of a non-pressure sensitive adhesive comprising a thermoplastic elastomer block copolymer on the permanent backing. Optionally, the adhesive may include an adhesion modifier such as a tackifying resin, a liquid rubber or a photocrosslinking agent. The tapes are useful for both wafer grinding and wafer dicing applications. A method of processing semiconductor wafers is disclosed.

37 Claims, No Drawings

SEMICONDUCTOR WAFER PROCESSING ADHESIVES AND TAPES

This is a continuation-in-part of application Ser. No. 08/499,896 filed Jul. 11, 1995, now abandoned.

BACKGROUND OF THE INVENTION

1. Field of the Invention

This invention relates generally to adhesive compositions and tapes useful for processing semiconductor wafers and, more specifically, to adhesive compositions and tapes that include a thermoplastic elastomer block copolymer and which are useful in the grinding and dicing of semiconductor wafers.

2. Description of the Related Art

Semiconductor integrated circuit (IC) chips are commonly used in electronic components, whether for sophisticated industrial machinery, automobiles or everyday household appliances. The production of semiconductor IC chips begins with the manufacture of semiconductor wafers containing many semiconductor elements. Ultimately, the wafer is sawn or diced into individual semiconductor elements (called die), each element becoming a semiconductor IC chip.

Typically, a semiconductor wafer is prepared by slicing or sawing a single, high purity silicon ingot into thin circular wafers about 500 to 1000 μm thick. A wafer may be doped to alter its electrical properties. Electronic circuitry is then applied to the front side of the wafer, usually by photolithography. Separation lines are also photolithographed onto the wafer to provide saw marks for eventual dicing of the wafer into individual semiconductor IC chips.

Wafer diameters were traditionally about 3 to 4 inches. However, as individual IC chips have become larger, the typical wafer diameter has increased to about 5 to 8 inches so as to permit more die to be formed from a single wafer. It is expected that wafer diameters will eventually expand to about 12 to 16 inches, and perhaps to even larger sizes.

To protect the delicate electronic circuitry from atmospheric contamination by dust, moisture, airborne corrosive acids and the like, the front side of the wafer is provided with a passivation layer which may be an inorganic material such as silicon oxynitride or an organic material such as polyimide.

To facilitate the manufacture of electronic components, it is desirable to reduce the thickness of the wafers (and hence the thickness of the semiconductor IC chips formed therefrom). A common process involves holding the front side of the wafer against a vacuum table while grinding the backside of the wafer to a thickness of about 200 to 500 μm in the presence of a water spray to remove the grinding debris. However, the wafers are inherently fragile and are susceptible to breaking during the grinding process, a problem which is enhanced as the wafer diameter becomes larger. In addition, the wafer grinding process generates dust that may contaminate the electronic circuitry. Moreover, the front side of the wafer is held against the vacuum table which could abrade the passivation layer and the underlying circuitry. Consequently, there is a need to protect the wafer (especially the front side) from breakage, contamination and abrasion.

Early approaches to this problem used a layer of paraffin wax over the front side of the wafer, with the wax being eventually removed by a solvent wash. The deficiencies of this approach are described in U.S. Pat. No. 4,853,286 (Narimatsu et al.). In other approaches, a photoresist coating was spin coated onto the front side of the wafer, but this did not always eliminate wafer breakage.

More recently, pressure sensitive adhesive (PSA) tapes have been employed to protect the front side of the wafer. Sometimes the PSA tapes are used alone and sometimes they are used in conjunction with a photoresist coating to provide a surface to which the PSA tape can stick. However, according to the technical literature, adhesive tapes have not provided a complete solution to the wafer protection problem. The previously mentioned U.S. Pat. No. 4,853,286 indicates that wafer breakage still occurs and that the adhesive surface accumulates dust that can contaminate the wafer. European Patent Publication No. 0 530 729 discusses the difficulty in subsequently removing the PSA tape if it has high initial adhesion to the wafer or if the adhesion increases from the time that the tape is applied to the wafer until it is removed.

Various adhesive tapes that are reportedly useful in semiconductor wafer backside grinding operations (sometimes referred to herein as "wafer grinding") have been described. For example, the aforementioned U.S. Pat. No. 4,853,286 discloses a wafer processing film that is used in the grinding of wafers to prevent breakage. The film includes a base film, a layer of a commercially available, common adhesive (such as an acrylic, ester, urethane or synthetic rubber adhesive), and an optional supporting film laminated to the non-adhesive side of the base film. U.S. Pat. No. 5,126,178 (Takemura et al.) describes a wafer processing film that includes a base film with a pressure sensitive adhesive on one side (which is protected by a removable release film), and a phosphoric acid-based surfactant on the backside. The pressure sensitive adhesive can be acryl-based, vinyl-based, or rubber-based, although an aqueous emulsion type pressure sensitive adhesive is preferred. Disclosed in U.S. Pat. No. 5,183,699 (Takemura et. al) is a wafer processing film which is used when grinding wafers so as to prevent breakage. The wafer processing film includes a base film and a layer of adhesive (e.g., a conventional acrylic or rubber-based adhesive) on the base film. A synthetic resin film, which has a surface roughness not greater than 2 μm, is arranged on the adhesive layer.

European Patent Publication No. 0 252 739 describes adhesive sheets which are applied to the face side of semiconductor wafers in the course of grinding the reverse side of the wafers. The adhesive sheets include a base sheet and a layer of a water-swellable, water-soluble adhesive which preferably consists essentially of a copolymer of an unsaturated carboxylic acid-containing monomer and an acrylic ester type monomer. European Patent Publication No. 0 530 729 discloses a pressure sensitive adhesive tape used in grinding the backside of a semiconductor wafer. The pressure sensitive adhesive, which reportedly has a small initial adhesion and shows no adhesion strength increase with time, comprises an aqueous acrylic resin emulsion adhesive, a non-ionic surfactant, an epoxy type and/or an aziridine type crosslinking agent, and a water soluble organic compound.

Japanese Kokai Patent Application No. 62-58638 discloses a member for protecting the patterned surface of a semiconductor wafer when the backside of the wafer is polished. The protective member includes a moisture resistant sheet having a high elastic modulus and dimensional stability. A pressure sensitive adhesive (e.g., an acrylic, rubber, polyvinyl ether or urethane type adhesive) is deposited on the moisture resistant sheet.

However, there still remains a need for an adhesive tape that has even greater utility in semiconductor wafer grinding processes. Preferably, such tapes will possess several desirable properties. For example, the tape should quickly provide sufficient initial adhesion to surfaces such as silicon, polyimide, silicon oxynitride and photoresist coatings such that the semiconductor wafers will readily survive post-processing steps yet be easily removed when required. Preferably, a single tape will provide acceptable initial adhesion to each of these surfaces so as to eliminate the need for storing different tapes for different surfaces. However, the final adhesion should not be so high that removing the tape breaks or fractures a larger number of wafers than is permitted under conventional industry standards (typically about one wafer or less per thousand), or leaves adhesive residue that could impair subsequent processing of the wafer.

It would also be desirable if the initial and final adhesion properties of the tape were maintained over several days and, more preferably, over several weeks of storage. That is, there should be no process or material-limiting increase in adhesion over time (sometimes preferred to as adhesion build), a problem associated with certain PSA's. Similarly, there should be no other significant change in adhesion over time, as could occur if surfactants and other mobile components in the adhesive migrate to the adhesive bond line so as to form a weak boundary layer. An adhesive that maintains its initial and final adhesion properties during storage would not only provide tapes having long shelf lives, but would also eliminate the need to carry out the grinding process shortly after taping the semiconductor wafers.

Another desirable attribute would be the ability to remove the adhesive tape without staining, which refers to a change in the optical density of the semiconductor wafer that is detected when the semiconductor wafer is viewed under a microscope and which may be the result of either microscopic amounts of adhesive residue being left on the passivation layer or partial removal of the passivation layer. It would also be helpful if the adhesive were insensitive to water so as to prevent the wafer from being loosened by the water spray used during grinding.

Following wafer grinding, there are typically several intermediate manufacturing steps before the semiconductor wafers are sawed or diced into individual semiconductor IC chips. Wafer dicing is conventionally carried out by attaching the ground backside of the wafer to the adhesive surface of a PSA tape (often called a dicing tape), securing the taped wafer to a vacuum table to restrain it against movement, and using a water-sprayed rotary diamond saw to cut along the saw marks previously photolithographed onto the semiconductor wafer. The individual semiconductor IC chips are then removed from the dicing tape. This operation is usually facilitated by a needle or probe that pushes up against the backing of the dicing tape in the area of the IC chip while a vacuum pick-up simultaneously grasps the top of the IC chip to remove it from the dicing tape. The removed IC chips may then be further processed immediately, or they may be stored for later assembly into a finished article.

Prior technical publications describe various difficulties encountered when using adhesive dicing tapes. For example, European Patent Publication Nos. 0 520 515 and 0 157 508 discuss the need for an adhesion level sufficient to permit the semiconductor wafers to stick to the tape but without being so large as to impede removal of the diced IC chips.

Adhesive tapes for use in wafer dicing operations have been previously described. For example, the aforementioned European Patent Publication No. 0 520 515 discloses a tape that is used to secure semiconductor wafers that are cut into individual patterns to form separate semiconductor chips. The tape includes a radiation curable pressure sensitive adhesive on one surface of a three layer laminated support film. Preferably, the pressure sensitive adhesive contains an acrylic adhesive, a cyanurate or isocyanurate compound, and a polyester or polyol urethane acrylate. European Patent Publication No. 0 588 180 describes a dicing tape that includes a radiation transparent film and a radiation crosslinkable pressure sensitive adhesive that contains a copolymerized radiation-initiator. The pressure sensitive adhesive may be synthesized from (meth)acrylic acid, (meth)acrylic ester, vinyl acetate or various vinyl alkyl ether monomers.

Japanese Kokai Patent Application No. 62-121781 describes a semiconductor wafer dicing film in which a conventional pressure sensitive adhesive is applied to a butene type polymer film. Japanese Kokai Patent Application No. 5-230426 discloses an adhesive tape for wafer dicing that includes an adhesive layer (especially an acrylic type adhesive) on a base film made of a rubber like elastic material.

The previously referred to European Patent Publication No. 0 157 508 describes a thin adhesive sheet which is used to protect a semiconductor wafer during the polishing step or to fix the wafer when cutting and separating the semiconductor wafer into the IC element chips. The adhesive sheet includes a light-permeable support and a pressure sensitive adhesive which can cure by light irradiation to form a three-dimensional network structure. The adhesive comprises a mixture of a rubber- or acryl-based pressure sensitive adhesive, a photopolymerizable compound, and a photopolymerization initiator.

However, there still remains a need for an adhesive tape that has even greater utility in semiconductor wafer dicing processes. Preferably, such tapes will possess several desirable properties. For example, the tape should provide sufficient initial adhesion to the silicon wafer (as well as other surfaces to which the tape may need to adhere such as gold plating or stainless steel machine parts) such that the resulting semiconductor IC chips will not come loose during wafer dicing. However, the final adhesion should not be so high that the semiconductor IC chips fracture or break upon removal from the tape in larger numbers than is permitted under conventional industry standards. It would also be desirable if the initial and final adhesion properties were maintained over several days and, more preferably, over several weeks of storage since several days or weeks may pass between the time that the semiconductor wafers are attached to the dicing tape and the time that the resulting semiconductor IC chips are removed from the tape after dicing. If the adhesion increases substantially over time, it may be necessary to remove the diced semiconductor IC chips from the tape and store them, unless they will be used immediately after dicing.

The semiconductor IC chip should also remove cleanly from the adhesive tape so as to not leave adhesive residue that could interfere with subsequent processing such as soldering and packaging of the IC chips. It would also be advantageous if the adhesive from the tape did not stick to the saw blade as this could require periodically interrupting the wafer dicing operation to clean the accumulated adhesive residue from the blade so as to prevent contamination of the semiconductor IC chips. Also, if the adhesive does not stick to the saw blade, then it could be possible to employ a thicker layer of adhesive which could be advantageous in preventing the saw blade from inadvertently cutting into the tape backing. If the tape backing is partially cut into during wafer dicing, the tape could be weakened and break prematurely during subsequent processing.

The adhesive should also be insensitive to water so as to prevent too many wafers from being loosened by the water spray used in the dicing process.

Finally, it would be advantageous to have a single adhesive tape that could be used in both wafer grinding and wafer dicing operations so as to eliminate the need for storing different tapes for different processes.

SUMMARY OF THE INVENTION

This invention relates generally to adhesive compositions and tapes useful for processing semiconductor wafers, including both the grinding and dicing of semiconductor wafers. The preferred adhesive compositions and wafer processing tapes of the invention provide low initial adhesion to important substrates such as photoresist layers, polyimide passivation layers, silicon oxynitride passivation layers and silicon. The preferred embodiments show minimal adhesion build over time such that semiconductor wafers and/or semiconductor IC chips can be readily removed from the wafer processing tapes and without leaving visible amounts of adhesive residue.

In one embodiment, the invention provides a semiconductor wafer processing tape that comprises a permanent backing and a layer of a non-pressure sensitive adhesive on the permanent backing. The adhesive comprises a thermoplastic elastomer block copolymer. Preferably the adhesive has a storage modulus at room temperature that is greater than $1\times10^6$ Pascals. The thermoplastic elastomer block copolymer comprises segments of a thermoplastic material (preferably styrene in an amount of about 5 to 30%, more preferably about 8 to 25%, most preferably 15 to 25%) and segments of a rubbery elastomer. Examples of particularly preferred thermoplastic elastomer block copolymers include those having blocks of styrene and blocks of ethylene/propylene such as styrene-ethylene/propylene-styrene block copolymer and styrene-ethylene/propylene-styrene-ethylene/propylene block copolymer.

Preferred semiconductor wafer processing tapes according to the invention exhibit a peel adhesion of about 20 to 500 (more preferably, about 20 to 200) grams per linear inch width to one of the following substrates: silicon, polyimide, silicon oxynitride, and photoresist coatings, and maintain this level of adhesion even after dwelling in contact with the substrate for 7 days under ambient conditions.

In order to provide the requisite adhesion to the substrate of interest, it may be desirable to include an adhesion modifier in the adhesive, such as a tackifying resin (typically less than 10% by weight, based on the combined weight of the thermoplastic elastomer block copolymer and tackifying resin, more preferably 3 to 8% by weight), a liquid rubber (typically less than 20% by weight based on the combined weight of the thermoplastic elastomer block copolymer and the liquid rubber, more preferably about 5% to less than 20% by weight), or a photocrosslinking agent. Tackifying resin and liquid rubber adhesion modifiers are particularly useful where the thermoplastic elastomer block copolymer is hydrogenated. A photocrosslinking agent is particularly useful where the thermoplastic elastomer block copolymer is unhydrogenated.

A further embodiment of the invention provides a semiconductor wafer processing tape comprising a permanent backing and a layer of a non-pressure sensitive adhesive on the permanent backing, wherein the adhesive comprises a hydrogenated thermoplastic elastomer block copolymer that displays a storage modulus at 20° C. of $2.7\times10^6$ to $4.0\times10^6$ Pascals. Styrene-ethylene/propylene-styrene and styrene-ethylene/propylene-styrene-ethylene/propylene block copolymers are particularly preferred in this embodiment.

One particularly preferred aspect of the invention provides a wafer dicing tape having the constructions described above. Such tapes can advantageously have relatively thin backings of about 12 to 50 $\mu$m (more preferably about 12 to 25 $\mu$m, most preferably about 12 to 15 $\mu$m) which backings can have an elongation at break of about 100 to 200% (more preferably about 120 to 165%) in the machine direction. Advantageously, these wafer dicing tapes can provide a peel adhesion of about 20 to 200 grams per linear inch width both at the time of applying the tape to a semiconductor wafer and after dwelling in contact with the wafer for 15 days under ambient conditions.

The invention also relates to a method of processing a semiconductor wafer. The method comprises the steps of:

(a) providing a semiconductor wafer;

(b) adhesively bonding the semiconductor wafer to the adhesive surface of a semiconductor wafer processing tape that comprises a permanent backing and a layer of a non-pressure sensitive adhesive on the permanent backing; and (c) processing the semiconductor wafer by either grinding the backside of the wafer or dicing the wafer into integrated circuit semiconductor chips.

The adhesive comprises a thermoplastic elastomer block copolymer such as those described above.

DETAILED DESCRIPTION OF THE PREFERRED EMBODIMENTS

This invention relates broadly to adhesive compositions and adhesive tapes that are useful in wafer processing applications, including both wafer grinding and wafer dicing processes. "Wafer grinding" as used herein refers to the process of grinding the backside of a semiconductor wafer so as to reduce its thickness, a procedure well known in the manufacture of semiconductor wafers. "Wafer dicing" as used herein refers to the sawing or dicing of a semiconductor wafer into individual die or semiconductor IC chips, which is also a well known step in the conversion of semiconductor wafers into IC chips.

The preferred adhesive compositions and wafer processing tapes of the invention provide low final adhesion to important semiconductor industry substrates such as photoresist layers, organic passivation layers (e.g., polyimide), inorganic passivation layers (e.g., silicon oxynitride), or silicon. The preferred embodiments show minimal adhesion build over time such that semiconductor wafers and/or semiconductor IC chips can be readily removed from the wafer processing tapes of the invention without breaking or fracturing in greater numbers than permitted by industrial standards and without leaving visible (to the unaided eye) amounts of adhesive residue. Highly preferred embodiments of the invention exhibit these attributes to several, and most preferably, to all of the substrate surfaces mentioned above. The highly preferred embodiments of the invention can also be removed from semiconductor wafers and/or semiconductor IC chips without staining.

In one aspect, the wafer processing tapes of the invention comprise a permanent backing and a layer of a non-pressure sensitive adhesive (non-PSA) on the permanent backing, wherein the non-PSA comprises a thermoplastic elastomer block copolymer.

By a "permanent backing" is meant a substrate or backing layer which is intended to form an integral part of the wafer processing tape rather than being a removable or releasable component, such as a temporary, protective release liner. To promote wide utility in the wafer processing tapes of the invention, the permanent backing will desirably possess several properties. For example, the permanent backing should be sufficiently flexible to permit it to be wound about a core into roll form for easily handling, storage and shipping. Also, the permanent backing should have the ability to be cut by a knife so as to permit the manufacture of wide webs that can be subsequently slit or cut to narrower widths that can be more easily used as well as to accommodate semiconductor IC chip manufacturing steps that will require the permanent backing to be cut. Preferably, the permanent backing will contain no more water extractable compounds or ionic components than are permitted under conventional wafer processing industry standards and, more preferably, will be free from such materials so as to reduce the water sensitivity of the permanent backing and to reduce the likelihood of the semiconductor wafers becoming contaminated by these materials.

Permanent backings useful in the wafer processing tapes of the invention may be provided as a single layer film or as a multi-layer film. The thickness of the backing may vary widely so long as the resulting tape can be readily handled by wafer grinding and wafer dicing equipment. Within these guidelines, the thickness of the permanent backing is typically about 5 to 500 $\mu$m, although for wafer dicing tapes it is more preferred that the permanent backing have a thickness of about 12 to 50 $\mu$m, more preferably a thickness of about 12 to 25 $\mu$m, and most preferably a thickness of about 12 to 15 $\mu$m. Also, wafer processing tapes specifically intended for use in dicing applications are preferred to be sufficiently stretchable that they can accommodate the use of a push-up needle or probe that may be employed to facilitate removal of a semiconductor die. Accordingly, permanent backings preferred for use in wafer dicing tapes display a tensile strength at break in the machine direction of about 70 to 240 kiloPascals (kPa) and, in the transverse direction, about 100 to 300 kPa. Similarly, the machine direction elongation at break of permanent backings preferred for use in wafer dicing applications is about 100 to 200% (more preferably about 120 to 165%), and about 30 to 90% in the transverse direction. Permanent backings having a tensile strength less than this range or an elongation greater than this range will stretch more when contacted by a semiconductor IC chip removal probe than the permanent backings of the invention preferred for use in wafer dicing processes. As a result, such backings not within the preferred ranges can result in slower manufacturing speeds since the probe travel distance will be increased. Moreover, as the stiffness of the permanent backing increases (i.e., high tensile strength, low elongation) it is easier to handle the larger diameter semiconductor wafers that are becoming more common.

Materials from which the permanent backings useful in the wafer processing tapes of the invention may be made include polyolefins (e.g. polyethylene, polypropylene, polybutene and polymethylpentene), ethylene/vinyl monomer copolymers (e.g. ethylene/(meth) acrylic acid copolymer and ethylene/vinyl acetate copolymer), polybutadiene, poly(vinylchloride), polyurethane, polyamide, and polyester (especially polyethylene terephthalate).

Adhesive compositions useful in the invention are non-PSA materials that comprise and, more preferably, consist essentially of a thermoplastic elastomer block copolymer. By a "non-PSA" is meant an adhesive that does not display pressure sensitive properties. A pressure sensitive adhesive is conventionally understood to refer to an adhesive that displays permanent and aggressive tackiness to a wide variety of substrates after applying only light pressure. An accepted quantitative description of a pressure sensitive adhesive is given by the Dahlquist criterion line, which indicates that materials having a storage modulus (G') of less than about $3 \times 10^5$ Pascals (measured at 10 radians/second at room temperature, about 20° to 22° C.) have pressure sensitive adhesive properties while materials having a G' in excess of this value do not. Thus, more specifically, a non-PSA, as used herein, refers to a material that has a storage modulus at least above the Dahlquist criterion line, and more preferably, a storage modulus above $1 \times 10^6$ Pascals.

By a "thermoplastic elastomer block copolymer" is meant a copolymer of segmented A and B blocks or segments and which displays both thermoplastic and elastomeric (i.e., rubbery) behavior. For simplicity, the expressions "thermoplastic elastomer" and "block copolymer" are sometimes used herein to refer to a thermoplastic elastomer block copolymer. Thus, a thermoplastic elastomer may be readily distinguished from natural and synthetic rubbers as well as conventional thermoplastics (e.g., acrylates and vinyls). Thermoplastic elastomers useful in the adhesive compositions and wafer processing tapes of the invention include multi-block copolymers having radial, linear A-B diblock, and linear A-B-A triblock structures, as well as blends of these materials. In these structures A represents a non-rubbery thermoplastic segment (e.g., an end block) and B represents a rubbery elastomeric segment (e.g., a midblock). However, small proportions of other monomers may enter into the block copolymers.

Illustrative thermoplastic A blocks include mono- and polycyclic aromatic hydrocarbons, and more particularly, mono- and polycyclic arenes. Illustrative mono- and polycyclic arenes include substituted and unsubstituted poly (vinyl)arenes of monocyclic and bicyclic structure. Preferred thermoplastic elastomers include thermoplastic segments of substituted or unsubstituted monocyclic arenes of sufficient segment molecular weight to assure phase separation at room temperature. The thermoplastic A blocks may comprise a homopolymer or copolymer of alkenyl arenes.

The alkenyl arenes in the thermoplastic A blocks are preferably monoalkenyl arenes. The term "monoalkenyl arene" will be taken to include particularly those o)f the benzene series such as styrene and its analogs and homologs including o-methylstyrene, p-methylstyrene, p-tertbutylstyrene, 1,3-dimethylstyrene, alpha-methylstyrene and other ring alkylated styrenes, particularly ring-methylated styrenes, and other mono-alkenyl polycyclic aromatic compounds such as vinyl naphthalene, vinyl anthracene and the like. The preferred monoalkenyl arenes are monovinyl monocyclic arenes such as styrene and alpha-methylstyrene, and styrene is particularly preferred.

The individual thermoplastic A blocks preferably have a number average molecular weight of at least about 6,000 so as to promote good domain formation and, more preferably, a number average molecular weight of about 8,000 to 30,000. The thermoplastic A blocks typically constitute about 5 to 30 percent, and preferably, about 8 to 25 percent by weight of the block copolymer. When the B blocks are comprised of a saturated rubbery elastomer segment, the most preferred thermoplastic elastomers contain A blocks constituting about 15 to 25% by weight of the block copolymer.

The A-B-A designation includes block copolymers that are branched as well as linear and also includes structures in which the end blocks are different from one another but are both derived from styrene or styrene homologs (such structures sometimes being known as A-B-C block copolymers).

The preferred rubbery elastomer B segments are polymer blocks composed of homopolymers of a monomer or copolymers of two or more aliphatic conjugated diene monomers. The conjugated dienes are preferably ones containing from 4 to 8 carbon atoms. Examples of suitable conjugated diene monomers include: 1,3-butadiene (butadiene), 2-methyl-1,3-butadiene (isoprene), 2,3-dimethyl-1,3-butadiene, 1,3-pentadiene (piperylene), 1,3-hexadiene, and the like.

In the most preferred styrenic block copolymers, the rubbery segments may be saturated by hydrogenation of unsaturated precursors such as a styrene-butadiene-styrene block copolymer having center blocks comprising a mixture of 1,4 and 1,2 isomers. Upon hydrogenation of the latter, a styrene-ethylene/butylene-styrene block copolymer is obtained. Similarly, a styrene-isoprene-styrene block copolymer precursor may be hydrogenated to yield a styrene-ethylene/propylene-styrene block copolymer. Rubbery materials such as polyisoprene, polybutadiene and styrene-butadiene rubbers may also be used to form the rubbery elastomer segments. Also particularly preferred are butadiene and isoprene. Mixtures of different conjugated dienes may be used too. The number average molecular weight of the B blocks for the linear diblock and triblock copolymers is preferably in the range of about 4,500 to 180,000.

Radial block copolymers useful in this invention are of the type described in U.S. Pat. No. 3,281,383 and conform to the following general formula: (A-B)nX, wherein A is a thermoplastic block polymerized from styrene or styrene homologs, B is a rubbery elastomeric block derived from conjugated dienes, as indicated above, X is an organic or inorganic connecting molecule with a functionality of 2–4 such as silicon tetrachloride, tin tetrachloride, or divinyl benzene, although others are mentioned in U.S. Pat. No. 3,281,383. X may have a higher functionality in which event "n" is a number corresponding to the functionality of A. The number average molecular weight of the radial block copolymers is preferably in the range of about 125,000 to 400,000.

The thermoplastic elastomer may also comprise a mixture of radial or linear triblock copolymers and simple diblock copolymers. However, the proportion of the diblock copolymers in the mixture of the triblock and diblock copolymers should not exceed about 85 percent by weight and normally lower percentages such as 30% would be used.

A wide variety of commercially available thermoplastic elastomers may be used (either alone or in combination) in the invention including the SOLPRENE family of materials (Phillips Petroleum Co.), the FINAPRENE family of materials (Fina), the TUFPRENE and ASAPRENE families of materials (Asahi), the STEREON family of materials (Firestone Synthetic Rubber & Latex Co.), the EUROPRENE SOL T family of materials (Enichem), the VECTOR family of materials (Dexco Polymers), and the CARIFLEX TR family of materials (Shell Chemical Co.). Also useful is the SEPTON family of materials (Kuraray Co. Ltd.), such as SEPTON 2002, 2005, 2007, 2023, 2043 and 2063. Also useful is the KRATON family of materials (Shell Chemical Co.), such as D-1101, D-1102, D-1107P, D-1111, D-1112, D-1114PX, D-1116, D-1117P, D-1118X, D-1119, D-1122X, D-1124, D-1125PX, D-1184, D-1300X, D-1320X, 4141, 4158, 4433, RP-6408, RP-6409, RP-6614, RP-6906, RP-6912, G-1650, G-1651, G-1652, G-1654X, G-1657, G-1701X, G-1702X, G-1726X, G-1750X, G-1765X, FG-1901X, FG-1921X, FG-1924, and TKG-101. In general, the KRATON series of hydrogenated thermoplastic elastomers is preferred.

A class of materials which is highly preferred are hydrogenated block copolymers comprising segments of styrene and segments of ethylene/propylene, especially those which have a reported coupling efficiency of 100%, have about 15 to 25% (even more preferably about 18 to 23%) styrene, a tensile strength of about 3100 psi, and about a 9% set at break. Such materials may exhibit the following storage modulus profile (at 10 radians/second): about $2.5 \times 10^6$ to $4.0 \times 10^6$ Pascals at 0° C., about $2.7 \times 10^6$ to $4.0 \times 10^6$ Pascals at 20° C., and about $2.9 \times 10^6$ to $3.8 \times 10^6$ Pascals at 40° C. Representative of this class of materials is KRATON RP-6906 and RP-6912, the latter being particularly unique as a linear, multi-block copolymer having four separate blocks (styrene-ethylene/propylene-styrene-ethylene/propylene). Blends of these materials are also useful. This class of materials advantageously provides a useful level of adhesion without adding adhesion modifiers.

Certain of the thermoplastic elastomers useful in the invention may have inherent levels of adhesion that are either too low (especially certain hydrogenated thermoplastic elastomers) or too high (especially certain unhydrogenated thermoplastic elastomers) for maximum utility in wafer processing applications. In addition, certain of the thermoplastic elastomers may insufficiently wet the substrate surface to be bonded, may form a low quality coating, may be difficult to coat, or a combination thereof, for best utility in wafer processing applications. Accordingly, the adhesive compositions of the invention may further and optionally comprise an adhesion modifier such as a tackifying resin or a liquid rubber to increase the inherent adhesion, wetting ability or coatability of the thermoplastic elastomer, or a photocrosslinking agent to decrease the inherent adhesion of the thermoplastic elastomer.

Tackifying resins can be added to the thermoplastic elastomer to enhance the initial adhesion strength thereof and to decrease the modulus thereof so as to improve the ability of the adhesive composition to quickly wet the surface of the substrate to which it is applied. Tackifying resins can also impart other desirable properties to the adhesive composition such as lower viscosity, improved coatability, and improved peel adhesion.

Tackifying resins useful in the adhesive compositions of the invention include resins derived by polymerization of from $C_5$ to $C_9$ unsaturated hydrocarbon monomers, polyterpenes, synthetic polyterpenes, and the like. The tackifying resins may contain ethylene unsaturation; however, saturated tackifying resins are preferred especially for use with hydrogenated thermoplastic elastomers. Hydrocarbon tackifying resins can be prepared by polymerization of monomers consisting primarily of olefins and diolefins and include, for example, residual by-product monomers of the isoprene manufacturing process. These hydrocarbon tackifying resins typically exhibit ball and ring softening points of from about 80° C. to 145° C., acid numbers of from about 0 to 2, and saponification values of less than one. Tackifying resins useful in the adhesive compositions of the invention are typically low molecular weight materials; e.g., a weight average molecular weight of about 350 to 2,500. It is also preferred that the tackifying resins be compatible with the thermoplastic elastomer, by which it is meant that there is no visible evidence of phase separation of these components at room temperature.

Examples of commercially available tackifying resins useful in the adhesive compositions of the invention and which are based on a $C_5$ olefin fraction include Wingtack™ 95 and Wingtack™ 115 (Wingtack Plus) tackifying resins available from Goodyear Tire and Rubber Co. Other hydrocarbon resins include Regalrez™ 1078, Regalrez™ 1094 and Regalrez™ 1126 available from Hercules Chemical Co., Inc.; Arkon resins, such as Arkon ™ P115, available from Arakawa Forest Chemical Industries; and Escorez™ resins available from Exxon Chemical Co. Examples of derivatives of rosin, especially hydrogenated derivatives, which are useful in the invention include Foral™ 85 and Foral™ 105 from Hercules Chemical Co., Inc.

Other suitable resins include terpene polymers, such as polymeric resinous materials obtained by polymerization and/or copolymerization of terpene hydrocarbons such as alicyclic, mono, and bicyclic monoterpenes and their mixtures, including carene, isomerized pinene, terpinene, turpentine, and various other terpenes. Commercially available resins of the terpene type include the Zonarez™ terpene B-series and 7000 series available from the Arizona Chemical Corp. Typically properties reported for the Zonarez™ terpene resins include ball and ring softening point of about 80° to 145° C., and saponification numbers of less than one.

The tackifying resin is used in an effective amount, which is an amount intended to give the appropriate level of adhesion to the substrate of interest. The actual amount of tackifying resin employed will depend on the level on adhesion desired, the substrate that is to be bonded, and the modulus of the thermoplastic elastomer. An insufficient amount of tackifying resin may not result in an adequate increase in adhesion. On the other hand, the tackifying resin should not be employed in an amount that will lead to an unacceptably high level of final adhesion as this could cause an unacceptably high level of semiconductor wafer breakage upon removal of the wafer processing tape. In general, the minimum amount of tackifying resin needed to achieve the desired adhesion while maintaining the non-PSA character of the adhesive is employed, which is an amount that is typically less than 10% by weight based on the combined weight of the tackifying resin and the thermoplastic elastomer. More preferably, about 3 to 8% by weight is used.

Alternatively, a liquid rubber may be used to increase the initial adhesion strength of the adhesive composition, decrease its modulus, and improve its ability to wet the surface to be bonded. The liquid rubber should be selected so as to be compatible with the thermoplastic elastomer, by which is meant there is no visible evidence of phase separation at room temperature. The molecular weight of the liquid rubber should be selected so as to inhibit the likelihood of the liquid rubber migrating to the adhesive bond line, which could cause a weak boundary layer and premature failure of the wafer processing tape. A molecular weight of about 25,000 to 50,000 is useful. While partially hydrogenated liquid rubbers may be used, those which are more fully hydrogenated are preferred, such as hydrogenated liquid isoprene rubber (e.g., Kuraray LIR 290, having a molecular weight of approximately 25,000 from Kuraray Co. Ltd.).

The liquid rubber should be used in an effective amount, which is an amount that is selected by the same criteria discussed above in conjunction with the tackifying resin. Within these parameters, a typical amount of liquid rubber is less than 20% by weight, based on the combined weight of the thermoplastic elastomer and the liquid rubber, more preferably from 5 to less than 20% by weight.

On the other hand, if the final adhesion of the thermoplastic elastomer is too high to permit easy removal of the wafer processing tape, then it may be appropriate to add a photocrosslinking agent to decrease the final adhesion of the thermoplastic elastomer. As used herein, a "photocrosslinking agent" refers to an agent which, upon exposure to ultraviolet radiation (e.g., radiation having a wavelength of about 250 to 400 nanometers), causes the thermoplastic elastomer to crosslink.

Photocrosslinking agents suitable for use in the invention include aldehydes, such as benzaldehyde, acetaldehyde, and their substituted derivatives; ketones such as acetophenone, benzophenone and their substituted derivatives such as Sandoray 1000 ™ (Sandoz Chemicals, Inc.); quinones such as the benzoquinones, anthraquinone and their substituted derivatives; thioxanthones such as 2-isopropylthioxanthone and 2-dodecylthioxanthone; and certain chromophore-substituted halomethyl-sym-triazines such as 2,4-bis-(trichloromethyl)-6-(3',4'-dimethoxyphenyl)-sym-triazine, although these latter materials are less preferred because of their potential for generating halogen contaminants.

The photocrosslinking agent is used in a curatively effective amount, by which is meant an amount that is sufficient to cause crosslinking of the adhesive to provide the desired final adhesion properties to the substrate of interest. An insufficient amount of photocrosslinking agent may cause inadequate curing (i.e., crosslinking) of the adhesive composition such that the adhesion still remains too high, while excess photocrosslinking agent may result in a non-uniform cure through the bulk of the adhesive composition. Within these parameters, the amount of photocrosslinking agent is typically about 0.05 to 2% by weight of the thermoplastic elastomer, more preferably about 0.2 to 1% by weight, and most preferably about 0.3 to 0.5% by weight.

Minor amounts of various additives can also be included in the adhesive compositions. Such additives include pigments, dyes, plasticizers, fillers, stabilizers, ultraviolet absorbers, antioxidants, processing oils, and the like. The amount of additives used can vary depending on the final properties desired.

To provide enhanced utility in wafer processing applications, the wafer processing tapes should be essentially free of ionic impurities that could migrate onto and contaminate the IC semiconductor wafer.

The adhesive compositions and the wafer processing tapes of the invention may be readily prepared. Typically, the thermoplastic elastomer and any tackifying resin or liquid rubber are solublized in a nonpolar organic solvent such as toluene (which may be blended with minor amounts of heptane and/or cyclohexane, or an equal parts by weight blend of methyl ethyl ketone and isopropanol) using a roller mill or other low shear mixing device at room temperature for several hours (typically about 2 to 4 hours) until no undissolved visible thermoplastic elastomer is visible. If a photocrosslinking agent is included it may be added at this time with additional blending on the roller mill to ensure complete dissolution. The resulting solublized thermoplastic elastomer may be diluted to a solids content (e.g., about 25%) that provides a coatable viscosity (e.g., about 4,000 to 5,000 cps) using additional nonpolar organic solvents of the type described above. A 50%/25%/25% by weight blend of toluene/methyl ethyl ketone/isopropanol is particularly preferred as a dilution solvent.

The solvent solution may then be applied to the permanent backing by a variety of coating methods including knife coating, slotted knife coating or reverse roll coating and then drying at a temperature (e.g., about 65° to 120° C.) and a time (e.g., several minutes to about one hour) so as to provide an adhesive tape. The thickness of the dried layer of adhesive may vary over a broad range of about 10 to several hundred (e.g., about 200) microns, although for wafer grinding proc(esses, a dry adhesive thickness of about 80 to 90 $\mu$m is more preferred, while a dry adhesive thickness of about 50 to 100 $\mu$m may be used for tapes employed in wafer dicing processes.

If a photocrosslinking agent has been used, the adhesive can be exposed to ultraviolet radiation having a wavelength of about 250 to 400 nm. The radiant energy in this preferred range of wavelengths required to crosslink the adhesive is about 100 to 1,500 millijoules/cm$^2$, more preferably about 200 to 800 millijoules/cm$^2$. The adhesive can be crosslinked either before or after processing the wafer (e.g., grinding or dicing).

Once the adhesive composition has been dried so as to provide a wafer processing tape, the adhesive surface of the tape may, optionally, be protected with a temporary, removable release liner such as a polyolefin (e.g., polyethylene or polypropylene) or polyester (e.g., polyethylene terephthalate) film, or a paper or plastic film that has been treated with a release material such as silicones, waxes, fluorocarbons, and the like.

The invention will be more fully appreciated with reference to the following non-limiting examples. The examples were evaluated with respect to certain test methods which are described below. All dimensions given in the test methods and the examples are nominal dimensions.

TEST METHODS

Peel Adhesion Test Method A

Peel adhesion to various substrates that would be encountered in wafer grinding applications was evaluated by attaching a sample of wafer processing tape (the tape having a width of 25 mm and a length of approxmiately 130 mm with two passes of an approximately 2 kg rubber-coated roller. The substrate with the wafer processing tape attached thereto was then allowed to dwell at 23° C. and 50% relative humidity (RH) for a period of time specified in the examples as "dwell."

Next, the opposite surface of the substrate (i.e., the surface of the substrate not having the wafer processing tape attached thereto) was securely taped to the adhesion test carriage of an Instrumentors, Inc. Slip-Peel Tester Model SP-102C-3M90 adhesion tester. One free end of the wafer processing tape test strip was attached to the adhesion tester's force sensor and the test strip was peeled from the substrate at an angle of 180° and at a rate of 30 cm/min. The peel adhesion was recorded in grams per linear inch width (gliw, which approximates grams per 25 mm) and the values reported in conjunction with the examples that follow are an average of at least 2 measurements.

Peel adhesion values should be about 20 to 500 gliw, and most preferably about 20 to 200 gliw to promote wide acceptance of the wafer processing tapes in the semiconductor wafer manufacturing industry. Preferably the adhesive composition shows minimal adhesion build over time; that is, a final adhesion that is still within these ranges.

Whether the wafer processing tapes were considered peelable was also qualitatively evaluated. A tape was considered peelable if it could be removed from the substrate without breaking or fracturing it, and if there was no adhesive residue visible to the unaided human eye on the substrate.

Substrates against which peel adhesion was measured were: (1) smooth polyimide (which had been applied to a smooth surfaced semiconductor silicon wafer); (2) an IC polyimide passivation layer representative of those conventionally used in the manufacture of semiconductor IC chips (which had been applied to a semiconductor silicon wafer that had electronic circuitry photolithographed on it such that the exposed surfaces for bonding were both polyimide and electronic circuitry materials); (3) an epoxy-based photoresist layer (representative of those commonly used in the manufacture of semiconductor wafers) that had been coated over the IC polyimide passivation layer just described); and (4) an IC silicon oxynitride passivation layer representative of those conventionally used in the manufacture of semiconductor IC chips (which had been applied to a semiconductor silicon wafer that had electronic circuitry photolithographed on it such that the exposed surfaces for bonding were both silicon oxynitride and electronic circuitry materials).

Peel Adhesion Test Method B

Peel adhesion to various substrates that would be encountered in wafer dicing applications was also evaluated. Test strips of wafer processing tape measuring approximately 115 mm×19 mm were cut with a fixed blade gap razor knife and adhesively bonded to smooth surfaced semiconductor silicon wafer, float glass and grade 315 stainless steel substrates with 2 passes of an approximately 2 kg rubber-coated roller. The substrate surfaces were precleaned with diacetone alcohol applied with a lintless cloth, then rinsed in heptane and air dried. The samples were conditioned at 21° C. and 55% RH for a period of time specified in the examples as "dwell." Peel adhesion was measured on an Instrumentors, Inc. Slip-Peel Tester Model SP- 102C 3M90 adhesion tester. One free end of the wafer processing tape test strip was attached to the adhesion tester's force sensor and the test strip was peeled from the substrate at an angle of 180° and at a rate of 30 cm/min. The peel adhesion was recorded in grams per linear inch width (gliw) and the values reported in conjunction with the examples that follow are an average of 5 measurements. For wafer dicing applications, the peel adhesion is preferably about 20 to 200 gliw, more preferably about 40 to 150 gliw, and most preferably about 100 gliw, although the actual adhesion can depend on the size of the die, smaller dies often requiring greater peel adhesion. Preferably the adhesive composition shows minimal adhesion build over time; that is, a final adhesion that is still within these ranges.

Semiconductor Wafer Grinding

The utility of the wafer processing tapes in wafer grinding applications was evaluated with a sample of tape having a width at least equal to the width of a semiconductor silicon wafer. The tape was applied in a class 1000 clean room at ambient temperature to the non-silicon surface of the wafer with one pass of an approximately 2 kg rubber-coated roller. The silicon wafer with the wafer processing tape attached thereto was then allowed to dwell at ambient conditions for no more than eight hours, and usually less than one hour.

The taped semiconductor wafer was then placed tape side down onto the vacuum chuck of a Disco Model DFG-83H/6 wafer grinder. In the grinding process the semiconductor wafer was passed under a series of three grinding wheels (each available from Disco Corp.). The first grinding wheel (model no. RS-01-2-40/60-NA-A) removed 120 $\mu$m of silicon, the second grinding wheel (model no. RS-01-2-20/30-NA-C) removed 100 $\mu$m of silicon, and the third grinding wheel (model no. RS-03-2-2/34-P) removed 10 $\mu$m of silicon. The total grinding time was about 10 minutes. Following the third grinding wheel, the semiconductor wafer was washed with water to remove grinding debris, air dried, and allowed to dwell at ambient conditions for about 16 hours.

Two 25 mm wide test strips of the exposed backing wafer processing tape were cut, each one approximately 0.5 inches in from the edge of the wafer, using a fixed blade gap razor knife. A piece of 50 mm wide Nitto BT 315 S removal tape (from Nitto Denka Company) was then applied down the center of the exposed backing of the wafer processing tape using two passes of an approximately 2 kg rubber-coated roller. The removal tape attached to the middle section of the wafer processing tape between the two cut strips was then removed by hand. The two edge pieces of the exposed backing of the wafer processing tape were removed by hand without the use of the removal tape. Next, the opposite surface of the semiconductor wafer (i.e., the surface not having the test strips attached thereto) was securely taped to the adhesion test carriage of an Instrumentors, Inc. Slip-Peel Tester Model SP-102C-3M90 adhesion tester. One end of the test strip was attached to the adhesion tester's force sensor and the removal tape with the wafer processing tape was peeled from the wafer at an angle of 180° and at a rate of 30 cm/min. The peel adhesion was recorded in grams per linear inch width and the values reported in conjunction with the examples are from a single measurement.

The wafer processing tape was considered peelable and therefore useful in wafer grinding applications if the tape could be removed from the semiconductor wafer without breaking or fracturing the wafer and if there was no adhesive residue remaining on the wafer that was visible to the unaided human eye.

Semiconductor Wafer Dicing

The specific utility of the wafer processing tapes as wafer dicing tapes was evaluated by stretching a 200 mm square sample of tape over a 147 mm diameter wafer tape ring (#8572 from Gustav Wirz AG, Berg, Switzerland) and locking the tape down with the outer lock ring. A 127 mm diameter polished silicon wafer having a thickness of about 0.43 mm was carefully placed on the stretched film to avoid capturing air between the wafer and the film. Gentle finger pressure along the backside of the tape was used to remove any possible air pockets. Within 30 minutes of attaching the silicon wafer, it was diced using a Disco Abrasive System automatic dicing saw (Model No. DAD-2H/5 fitted with a Disco NDCZ-205-L saw blade having a 50.8 mm outside diameter and a thickness of 0.050 mm). The dicing saw was run at a rate of 25.4 mm/sec using a water wash of 30 psi to cut the silicon waftr into die measuring 4.3 mm by 4.3 mm on kerf centers. The number of die washed off the tape during the wafer dicing process was recorded.

Semiconductor Wafer Staining

The tendency of the wafer processing tapes to cause staining of a semiconductor wafer was evaluated by placing the test surface of a wafer (i.e., the surface from which the wafer processing tape was removed) under a Zeiss Axioplan Universal Semiconductor microscope equipped with a Zeiss Microscope Camera Model MM 100 and optically examining the entire surface under at least a 128× power of magnification for changes in the optical density of the test surface. Any change in the optical density of the test surface was considered as stain. The percentage of the surface area that was stained was then estimated. In general, the presence of stain is considered undesirable in that it may limit how broadly the wafer processing tape is used.

Tensile Strength and Percent Elongation at Break

The tensile strength and elongation at break properties of several of the examples were tested. More specifically, test samples were prepared by cutting test strips measuring approximately 150 mm×20 mm using a fixed blade gap razor knife. Any release liner associated with the samples was removed prior to testing. Test samples were preconditioned at 21° C. and 55% RH for at least four hours before measuring on an Instron Tensile Tester Model 1122 having a 50 pound load cell, a 125 mm/minute crosshead speed, and a 50 mm gap. Samples were tested in both the machine and the transverse directions with both the tensile strength and percent elongation being measured at break. Tensile strength was calculated in pounds per square inch as the force at break divided by the cross-sectional area of the tape and then converted to kiloPascals (kPa). The results reported below in the examples are an average of five measurements.

EXAMPLES 1 to 11

A series of wafer processing tapes according to the invention was prepared. The adhesive composition used in the wafer processing tapes for each of the examples was prepared by combining 30 grams (g) of thermoplastic elastomer and 70 g of toluene in a one quart glass jar, closing the jar, and placing the jar on a roller mill until no undissolved thermoplastic elastomer was visible. Total mixing time was less than eight hours. The adhesive composition solution was then coated onto a 50 $\mu$m thick polyethylene terephthalate film using a knifebox with a bullnose knife configured with a coating gap that insured a dry adhesive coating thickness of about 76 $\mu$m. Once coated, the wafer processing tapes were dried for about 10 minutes at room temperature followed by 10 minutes at 82° C.

Table 1 below shows the trade name of the thermoplastic elastomer used in each of the examples along with a description of the type of thermoplastic elastomer and the percentage of styrene (% styrene) in the thermoplastic elastomer. In Table 1 (as well as in the subsequent tables), SIS refers to a styrene-isoprene-styrene block copolymer, SBS refers to a styrene-butadiene-styrene block copolymer, SB refers to a styrene-butadiene block copolymer, SEBS refers to a styrene-ethylene/butylene-styrene block copolymer, SEPS refers to a styrene-ethylene/propylene-styrene block copolymer, and SEPSEP refers to a styrene-ethylene/propylene-styrene-ethylene/propylene block copolymer. The KRATON materials are commercially available from Shell Chemical Company.

Also shown in Table 1 are the results of the peel adhesion test (method A) where the substrate was smooth polyimide and the dwell time was 1 day, including observations as to the peelability of the wafer processing tapes.

TABLE 1

| Example | Thermoplastic Elastomer Trade Name | Type | % Styrene | Testing Peel Adhesion (gliw) | Peelable |
|---|---|---|---|---|---|
| 1 | Kraton D-1107P | SIS | 14 | 1448 | Yes |
| 2 | Kraton D-1114PX | SIS | 19 | 852 | Yes |
| 3 | Kraton D-1102 | SBS | 28 | * | No |
| 4 | Kraton D-1118X | SBS | 30 | * | No |
| 5 | Kraton D-1122X | (SB)n | 37 | 80 | Yes |
| 6 | Kraton G-1657 | SEBS | 13 | 40 | Yes |
| 7 | Kraton G-1726X | SEBS | 30 | 11 | Yes |
| 8 | Kraton G-1650 | SEBS | 29 | 31 | Yes |
| 9 | Kraton G-1701X | SEP | 37 | 0 | Yes |
| 10 | Kraton RP-6906 | SEPS | 18 | 20 | Yes |
| 11 | Kraton RP-6912 | SEPSEP | 23 | 199 | Yes |

*Peel adhesion was too high to permit removal of the tape.

Table 1 shows that saturated thermoplastic elastomers are generally preferred for use in the invention (although example 6 showed adhesion build over time and example 8 did not yield a smooth surface upon drying), as the unsaturated materials tend to give higher adhesion. However, the adhesion levels of the unsaturated materials could be usefully lowered through the incorporation of a photocrosslinking agent as described above and as shown below in other examples. Though not shown specifically in Table 1, each example had a storage modulus above the Dahiquist criterion line.

EXAMPLES 12 to 19

A series of wafer processing tapes according to the invention was prepared following the procedure described in conjunction with examples 1 to 11 except using the thermoplastic elastomers shown below in Table 2. SEB(I)S refers to a SEBS block copolymer having an isoprene arm. The SEPTON materials are commercially available from Kuraray Co. Ltd. The wafer processing tapes were evaluated for peel adhesion (using test method A) on the substrates and with the dwell times specified in Table 2, along with observations about the peelability of the tapes. In these examples, the polyimide substrate was an IC polyimide passivation layer as described above. Examples 5, 6, 7, 10, and 11 are repeated in Table 2.

TABLE 2

| Example | Thermoplastic Elastomer Trade Name | Type | % Styrene | Substrate | Dwell (days) | Testing Peel Adhesion (gliw) | Peelable |
|---|---|---|---|---|---|---|---|
| 12 | Kraton D-1125PX | SIS | 30 | IC polyimide | 1 | 795 | yes |
|  |  |  |  | Photoresist | 1 | 193 | yes |
| 13 | Septon 2002 | SEPS | 30 | IC polyimide | 1 | 45 | yes |
|  |  |  |  | IC polyimide | 7 | 91 | yes |
|  |  |  |  | Photoresist | 1 | 3 | yes |
|  |  |  |  | Photoresist | 7 | 9 | yes |
| 14 | Septon 2005 | SEPS | 20 | IC polyimide | 1 | 79 | yes |
|  |  |  |  | IC polyimide | 7 | 62 | yes |
|  |  |  |  | Photoresist | 1 | 11 | Yes |
|  |  |  |  | Photoresist | 7 | 93 | yes |
| 15 | Septon 2007 | SEPS | 30 | IC polyimide | 1 | 6 | yes |
|  |  |  |  | IC polyimide | 7 | 3 | yes |
|  |  |  |  | Photoresist | 1 | 3 | yes |
|  |  |  |  | Photoresist | 7 | 3 | yes |
| 16 | Septon 2023 | SEPS | 13 | IC polyimide | 1 | 45 | yes |
|  |  |  |  | IC polyimide | 7 | 162 | yes |
|  |  |  |  | Photoresist | 1 | 17 | yes |
|  |  |  |  | Photoresist | 7 | 28 | yes |
| 17 | Septon 2043 | SEPS | 13 | IC polyimide | 1 | 1362 | yes |
|  |  |  |  | IC polyimide | 7 | 1986 | yes |
|  |  |  |  | Photoresist | 1 | 851 | yes |
|  |  |  |  | Photoresist | 7 | 993 | yes |
| 18 | Septon 2063 | SEPS | 13 | IC polyimide | 1 | 1192 | yes |
|  |  |  |  | IC polyimide | 7 | 1759 | yes |

TABLE 2-continued

| Example | Thermoplastic Elastomer | | | Testing | | | |
|---|---|---|---|---|---|---|---|
| | Trade Name | Type | % Styrene | Substrate | Dwell (days) | Peel Adhesion (gliw) | Peelable |
| 19 | Kraton TKG101 | SEB(I)S | 18 | Photoresist | 1 | 150 | yes |
| | | | | Photoresist | 7 | 709 | yes |
| | | | | IC polyimide | 1 | 766 | yes |
| | | | | IC polyimide | 7 | 1220 | yes |
| 10 | Kraton RP-6906 | SEPS | 18 | IC polyimide | 1 | 20 | yes |
| | | | | IC polyimide | 7 | 62 | yes |
| | | | | Photoresist | 1 | 31 | yes |
| | | | | Photoresist | 7 | 54 | yes |
| 5 | Kraton D-1122X | (SB) | 37 | IC polyimide | 1 | 187 | yes |
| | | | | IC polyimide | 7 | 454 | yes |
| | | | | Photoresist | 1 | 20 | yes |
| | | | | Photoresist | 7 | 213 | yes |
| 6 | Kraton G-1657 | SEBS | 13 | IC polyimide | 1 | 256 | yes |
| | | | | IC polyimide | 7 | 1221 | yes |
| | | | | Photoresist | 1 | 28 | yes |
| | | | | Photoresist | 7 | 102 | yes |
| 7 | Kraton G-1726X | SEBS | 30 | IC polyimide | 1 | 3 | yes |
| | | | | IC polyimide | 7 | 6 | yes |
| | | | | Photoresist | 1 | 3 | yes |
| 11 | Kraton 6912 | SEPSEP | 23 | IC polyimide | 1 | 94 | yes |
| | | | | IC polyimide | 7 | 210 | yes |
| | | | | Photoresist | 1 | 20 | yes |
| | | | | Photoresist | 7 | 40 | yes |

Table 2 shows that materials which had relatively high adhesion to the smooth polyimide in Table 1 also had relatively high adhesion to the substrates in Table 2, although adhesion to the photoresist layer was often less than the adhesion to the IC polyimide passivation layer. As a class, the SEPS block copolymers are generally most preferred. Though not shown specifically in Table 2, each example had a storage modulus above the Dahlquist criterion line.

EXAMPLES 20 to 25

A series of wafer processing tapes according to the invention was prepared following the procedure described in conjunction with examples 1 to 11 except using blends of two different thermoplastic elastomers as shown below in Table 3 where the relative percentages of the thermoplastic elastomers are given as percentages by weight. Also shown in Table 3 are the results of the method A peel adhesion test in which the substrate was an IC polyimide passivation layer, along with observations about the peelability of the tapes.

TABLE 3

| Example | Thermoplastic Elastomer | | Testing | | |
|---|---|---|---|---|---|
| | Amounts and Trade Names | Type | Dwell (days) | Peel Adhesion (gliw) | Peelable |
| 20 | 90%/10% Kraton RP-6906/ Septon 2043 | SEPS/ SEPS | 1 7 | 111 170 | yes yes |
| 21 | 75%/25% Kraton RP-6906/ Septon 2043 | SEPS/ SEPS | 1 7 | 128 119 | yes yes |
| 22 | 50%/50% Kraton RP-6906/ Septon 2043 | SEPS/ SEPS | 1 7 | 795 283 | yes yes |
| 23 | 90%/10% Kraton RP-6906/ Kraton TKG101 | SEPS/ SEB(I)S | 1 7 | 119 99 | yes yes |
| 24 | 75%/25% Kraton RP-6906/ Kraton TKG101 | SEPS/ SEB(I)S | 1 7 | 173 108 | yes yes |
| 25 | 50%/50% Kraton RP-6906/ Kraton TKG101 | SEPS/ SEB(I)S | 1 7 | 510 233 | yes yes |

Table 3 shows that peel adhesion can be usefully controlled by varying the type of block copolymer used in a blend and the relative amounts of the block copolymers used in the blend. Especially preferred are blends of different SEPS block copolymers or blends of these with modified SEBS block copolymers (e.g., SEB(I)S block copolymers). Though not shown specifically in Table 3, each example had a storage modulus above the Dahlquist criterion line.

EXAMPLES 26 to 30

A series of wafer processing tapes according to the invention was prepared as described in conjunction with examples 1 to 11 except that the adhesive composition was prepared by combining varying amounts of Kraton G-1650 thermoplastic elastomer and Regalrez 1094 tackifying resin (a hydrocarbon resin from Hercules, Inc.) with 115 g of toluene. More specific information concerning the adhesive formulations used in examples 26 to 30 is given in Table 4 below. Also reported in Table 4 are the results of the peel adhesion test (method A) in which the substrate was an IC polyimide passivation layer, along with observations about the peelability of the tapes.

8% by weight. Though not shown specifically in Table 4, each example had a storage modulus above the Dahlquist criterion line.

EXAMPLES 31 and 32

A pair of wafer processing tapes according to the invention was prepared as described in conjunction with examples 1 to 11 except that the adhesive composition comprised varying amounts of Kraton PP-6906 thermoplastic elastomer, and Kuraray LIR-290 liquid hydrogenated isoprene polymer having a molecular weight of about 25,000 as a liquid rubber component. In addition, the adhesive compositions of examples 31 and 32 were prepared in a one pint glass jar. The wafer processing tape of example 32 also included a primer layer, the composition of which is described below in conjunction with example 37. Additional information about the adhesive compositions of these examples is given in Table 5 below. Example 10 is repeated

TABLE 4

| | Adhesive Composition | | | Testing | | |
|---|---|---|---|---|---|---|
| Example | Amount of Thermoplastic Elastomer (g) | Amount of Tackifying Resin (g) | % Tackifying Resin | Dwell (days) | Peel Adhesion (gliw) | Peelable |
| 26 | 48.5 | 1.5 | 3 | 1 | 6 | yes |
| | | | | 7 | 34 | yes |
| 27 | 47.0 | 3.0 | 6 | 1 | 82 | yes |
| | | | | 7 | 77 | yes |
| 28 | 45.5 | 4.5 | 9 | 1 | 235 | yes |
| | | | | 7 | 312 | yes |
| 29 | 44.0 | 6.0 | 12 | 1 | 184 | yes |
| | | | | 7 | 340 | yes |
| 30 | 42.5 | 7.5 | 15 | 1 | 193 | yes |
| | | | | 7 | 653 | yes |

Table 4 shows that a tackifying resin may be useful in increasing the peel adhesion strength of an adhesive composition. Typically, the amount is less than 10% by weight (based on the commbined weight of the thermoplastic elastomer and the tackifying resin), more preferably, about 3 to in Table 5. Also reported in Table 5 are the results of the peel adhesion test (method A) in which the substrates were a polyimide passivation layer and an epoxy-based photoresist layer along with observations about the peelability of the tapes.

TABLE 5

| | Adhesive Composition | | | Testing | | | |
|---|---|---|---|---|---|---|---|
| Example | Amount of Thermoplastic Elastomer (g) | Amount of Liquid Rubber (g) | % Liquid Rubber | Substrate | Dwell (days) | Peel Adhesion (gliw) | Peelable |
| 10 | 30 | 0 | 0 | Polyimide | 1 | 43 | yes |
| | | | | Polyimide | 7 | 45 | yes |
| | | | | Photoresist | 1 | 51 | yes |
| | | | | Photoresist | 7 | 74 | yes |
| 31 | 47.5 | 2.5 | 5 | Polyimide | 1 | 37 | yes |
| | | | | Polyimide | 7 | 96 | yes |
| | | | | Photoresist | 1 | 20 | yes |
| | | | | Photoresist | 7 | 28 | yes |
| 32 | 45.0 | 5.0 | 10 | Polyimide | 1 | 56 | yes |
| | | | | Polyimide | 7 | 105 | yes |
| | | | | Photoresist | 1 | 17 | yes |
| | | | | Photoresist | 7 | 23 | yes |

Table 5 shows that small amounts of liquid rubber may be useful in modifying the peel adhesion strength of the adhesive compositions. The amount of liquid rubber used is typically less than 20% by weight (based on the combined weight of the thermoplastic elastomer and the liquid rubber), more preferably, about 5 to less than 20% by weight. Though not shown specifically in Table 5, each example had a storage modulus above the Dahlquist criterion line.

The wafer processing tapes of examples 6, 10, 11, 30 and 32 were subjected to the semiconductor wafer grinding test described above and then its peal adhesion measured (using the procedure described in conjunction with the semiconductor wafer grinding test) with the results reported below in Table 6. Once the wafer processing tape was removed, the surface of the semiconductor wafer was examined in accordance with the semiconductor wafer staining test described above, the results of which are also shown in Table 6, along with observations about the peelability of the tapes.

toluene in a one pint glass jar which was then closed and placed on a roller mill and allowed to mix until no undissolved thermoplastic elastomer was visible. At this time, benzophenone photocrosslinking agent was added and the blend was mixed for an additional one hour on the roller mill to ensure dissolution on of the benzophenone. The adhesive composition was then coated onto 50 μm thick polyethylene terephthalate film and dried using the procedure described in conjunction with examples 1 to 11. After drying, the adhesive-coated film was passed under a bank of four 200 Watt/inch medium pressure mercury lamps at a rate of 2.9 m/min. so as to provide a total dose of 600 mJ/cm$^2$ to the adhesive coated sheet. (Light output was measured with a model UM 365 H-S light meter from Electronic Instrumentation Technologies, Inc., Sterling Va.) More information concerning the composition of the adhesives used in these examples is given below in Table 7 where the percent of photocrosslinking agent is based on the weight of thermoplastic elastomer. The adhesives described in examples 5

TABLE 6

| | Adhesive Composition | | | Testing | | |
|---|---|---|---|---|---|---|
| Example | Thermoplastic Elastomer | % Tackifying Resin | % Liquid Rubber | Peel Adhesion (gliw) | % Stain | Peelable |
| 6 | Kraton G-1657 (SEBS) | 0 | 0 | 56 | 0 | yes |
| 10 | Kraton RP-6906 (SEPS) | 0 | 0 | 43 | 0 | yes |
| 11 | Kraton RP-6912 (SEPSEP) | 0 | 0 | 57 | 0 | yes |
| 30 | Kraton G-1650 (SEBS) | 15 | 0 | 85 | 10 | yes |
| 32 | Kraton RP-6906 (SEPS) | 0 | 10 | 370 | 5 | yes |

EXAMPLES 33 to 36

A series of wafer processing tapes according to the invention was prepared. The adhesive composition used in the wafer processing tape for each example was obtained by combiming 20 g of a thermoplastic elastomer with 46 g of and 12 were remade and retested for Table 7. Also shown in Table 7 are the results of the peel adhesion test (method A) on various substrates (an IC polyimide passivation layer and an epoxy-based photoresist layer) along with observations about the peelability of the tape.

TABLE 7

| | Adhesive Composition | | | Testing | | |
|---|---|---|---|---|---|---|
| Example | Thermoplastic Elastomer | % Photocrosslinking Agent | Substrate | Dwell (days) | Peel Adhesion (gliw) | Peelable |
| 12 | Kraton D-1125PX | 0 | IC polyimide | 1 | 993 | yes |
| | | | IC polyimide | 7 | 1476 | yes |
| 33 | Kraton D-1125PX | 0.5 | IC polyimide | 1 | 9 | yes |
| | | | IC polyimide | 7 | 11 | yes |
| 34 | Kraton D-1125PX | 1.0 | IC polyimide | 1 | 11 | yes |
| | | | IC polyimide | 7 | 270 | no |
| 35 | Kraton D-1125PX | 2.0 | IC polyimide | 1 | 675 | no |
| | | | IC polyimide | 7 | 1178 | no |

TABLE 7-continued

| | Adhesive Composition | | | Testing | | |
|---|---|---|---|---|---|---|
| Example | Thermoplastic Elastomer | % Photocross-linking Agent | Substrate | Dwell (days) | Peel Adhesion (gliw) | Peelable |
| 5 | Kraton D-1122X | 0 | IC polyimide | 20 min* | 6 | yes |
| | | | IC polyimide | 3 | 454 | yes |
| | | | Photoresist | 20 min.* | 3 | yes |
| | | | Photoresist | 3 | 213 | yes |
| 36 | Kraton D-1122X | 0.5 | IC polyimide | 20 min.* | 1 | yes |
| | | | IC polyimide | 3 | 119 | yes |
| | | | Photoresist | 20 min.* | <1 | yes |
| | | | Photoresist | 3 | 60 | yes |

*"min." means minutes.

Table 7 shows that a photocrosslinking agent can be used to reduce the peel adhesion of an unhydrogenated thermoplastic elastomer, especially SIS and SBS thermoplastic elastomers. However, increasing amounts of photocrosslinking agent may result in adhesive residue on the bonded surface after removal of the wafer processing tape. The amount of photocrosslinking agent is typically about 0.05 to 2% by weight of the thermoplastic elastomer, more preferably about 0.2 to 1% by weight, and most preferably about 0.3 to 0.5% by weight. Though not shown specifically in Table 7, each the thermoplastic elastomer of example had a storage modulus above the Dahlquist criterion line.

An additional series of three wafer processing tapes according to the invention was then prepared. These tapes used the adhesive composition of example 18 (a SEPS thermoplastic elastomer) to which was added 0%, 0.5% and 1.0% benzophenone photocrosslinking agent (based on the weight of the thermoplastic elastomer). The adhesive composition with photocrosslinker was then coated onto a 50 μm thick polyethylene terephthalate film to a dry thickness of about 85 μm and dried following the procedure described in conjunction with examples 1 to 11. After drying, the adhesive-coated film was passed six times under a single 200 Watt/inch medium pressure mercury lamp at a rate of 24 m/min. so as to provide a total dose of 600 mJ/cm² to the adhesive coated sheet. (Light output was measured with a model UM 365 H-S light meter as above.)

The second series of wafer processing tapes was then evaluated for peel adhesion (using test method A) and a 16 hour dwell time on an IC polyimide substrate. (The IC polyimide substrate was representative of those used in the semiconductor wafer manufacturing industry but with a different polyimide and a different electronic circuitry pattern than used in the other examples.) The peel adhesion of the sample not containing benzophenone was 170 gliw, the peel adhesion of the sample containing 0.5% benzophenone was 118 gliw, and the peel adhesion of the sample containing 1.0% benzophenone was 37 gliw. All three samples were peelable. The storage modulus of the thermoplastic elastomer used in these examples was above the Dahlquist criterion line.

The second series of examples shows that a photocrosslinking agent can be usefully employed to reduce the peel adhesion of adhesive compositions comprising hydrogenated thermoplastic elastomers, especially those that are based on styrene-ethylene/propylene-styrene.

EXAMPLE 37

Into a closed-head five gallon pail was added 3.85 kg of Kraton RP-6906 thermoplastic elastomer and 7.15 kg of toluene. The closed pail was then placed on a large two roller mill and the mixture was allowed to mix until no undissolved thermoplastic elastomer was visible (about 16 hours). The thermoplastic elastomer solution was then diluted to a 25% solids concentration using a dilution solvent comprised of 50/25/25 weight/weight/weight/% of toluene/methyl ethyl ketone/isopropanol. Using a positive displacement pump, the thermoplastic elastomer solution was slot die coated to a dry thickness of 84 μm onto a 50 μm thick polyethylene terephthalate backing. The backing had been previously coated with a 5 μm thick primer layer (dry thickness) that comprised 10% solids polymer/solvent solution in which the solvent consisted of a 65/35 weight/weight % of toluene/methyl ethyl ketone blend and the polymer consisted of a blend of equal parts of polychloroprene rubber, calcium zinc resonate, terpene resin and equal parts of an acrylonitrile-butadiene rubber polymer and a phenolic resin, the combined parts of the latter two materials being equal to about 60% of the total polymer weight.

The primer and the thermoplastic elastomer solutions were separately dried by passing the wet-coated film through a four zone impinged air drying oven with zones one and two set at about 65° C., zone three set at about 80° C., and zone four set at about 93° C., and at line speeds of about 7.6 and 3 meters/min., respectively. Upon exiting the oven, a silicone-coated polyethylene terephthalate release liner was laminated to the dried adhesive surface and the structure was then rolled upon itself The rolled goods were then converted in a class 1000 clean room into individual rolls using a Dusenberry shear slitter.

Example 37 was then evaluated using the semiconductor wafer grinding test with an IC polyimide passivation layer and an epoxy-based photoresist layer as the substrates. Peel adhesion was measured as described in the semiconductor wafer grinding test. The results are shown below in Table 8 along with observations about the condition of the substrate surface after removing the wafer processing tape. Also shown in Table 8 are three commercially available wafer processing tapes that are widely used in the manufacture of semiconductor wafers. In general the commercially available tapes include an ethylene/vinyl acetate copolymer backing (about 125 to 150 µm thick) with an acrylic adhesive layer (thickness less than 25 µm) on the backing.

TABLE 8

| Example | Test Substrate | Dwell (days) | Peel Adhesion (gliw) | Observations |
|---|---|---|---|---|
| 37 | IC polyimide | 7 | 23 | Occasional trace amount of staining |
|  | Photoresist | 1 | 85 | No staining or other damage |
|  | Silicon oxynitride | 1 | 34 | No staining or other damage |
| Mitsui Toatsu SB135S-B | IC polyimide | 7 | 85 | Medium level of staining |
|  | Photoresist | 1 | 199 | Fracture of photoresist layer; high level of staining |
|  | Silicon oxynitride | 1 | 108 | No staining or other damage |
| Mitsui Toatsu SB205S-1 | IC polyimide | 7 | 170 | Low level of staining |
|  | Photoresist | 1 | 284 | Fracture of photoresist layer; high level of staining |
| Nitto Denko BT150E-AL | IC polyimide | 7 | 1477 | High level of staining |
|  | Photoresist | 1 | 256 | Fracture of photoresist layer; high level of staining |

Table 8 shows the superior performance of the wafer processing tapes of the invention as compared to three commercially available, widely used tapes. The wafer processing tapes of the invention showed only an occasional trace amount of staining on IC polyimide whereas the commercially available tapes showed higher levels of staining. On the photoresist layer, the wafer processing tape of example 37 did not show any staining or damage; the commercially available tapes showed both fracturing and staining. Though not shown specifically in Table 8, example 37 had a storage modulus above the Dahlquist criterion line.

EXAMPLES 38 to 43

A series of wafer processing tapes according to the invention was prepared. In each example, the adhesive composition was obtained by preparing a solvent solution of the thermoplastic elastomer which comprised 24% by weight thermoplastic elastomer, 69% by weight toluene, and 7% by weight isopropanol. These ingredients were combined into a one-gallon metal can and then mixed on roller mill for 24 hours until there was no visible evidence of undissolved thermoplastic elastomer. The adhesive composition was then coated onto a polyethylene terephthalate backing that had been primed as described in conjunction with example 37. Adhesive coating was carried out at a rate of 5 feet per minute utilizing a 9 inch wide knifebox with a bulinose knife that was set to provide a dry adhesive thickness of about 50 µm. The adhesive-coated film was then dried. The thermoplastic elastomer and the backing thickness were varied as shown below in Table 9.

TABLE 9

| Example | Thermoplastic Elastomer Trade Name | Type | % Styrene | Backing Thickness (µm) |
|---|---|---|---|---|
| 38 | Kraton G-1657 | SEBS | 13 | 23 |
| 39 | Kraton RP-6906 | SEPS | 18 | 23 |
| 40 | Kraton 6912 | SEPSEP | 23 | 23 |
| 41 | Kraton G-1657 | SEBS | 13 | 14 |
| 42 | Kraton RP-6906 | SEPS | 18 | 14 |
| 43 | Kraton 6912 | SEPSEP | 23 | 14 |

The tensile strength and elongation properties of several of the examples were then tested as described above and with the results reported below in Table 10. Also shown below in Table 10 is Nitto Denko V-12-S which is a commercially available, widely used wafer dicing tape that includes an approximately 110 µm thick vinyl backing and an approximately 10 µm thick acrylic pressure sensitive adhesive.

TABLE 10

| | Machine Direction | | Transverse Direction | |
|---|---|---|---|---|
| Example | Tensile Strength (kPa) | Elongation (%) | Tensile Strength (kPa) | Elongation (%) |
| 38 | 209 | 164 | 264 | 68 |
| 39 | 190 | 142 | 300 | 79 |
| 41 | 95 | 119 | 125 | 31 |
| 42 | 100 | 128 | 175 | 86 |
| Nitto Denko V-12-S | 135 | 262 | 90 | 363 |

Table 10 shows that the wafer processing tapes of the invention have higher transverse direction tensile strength and less elongation (in both directions) than the commercially available tape. Permanent backings having a low tensile strength or a high elongation will stretch more when contacted by a semiconductor IC chip removal probe than permanent backings with a higher tensile strength or a lower elongation. Backings that stretch more can result in slower manufacturing speeds since the probe travel distance will be increased. Moreover, as the stiffness of the permanent backing increases (i.e., high tensile strength, low elongation) it is easier to handle the larger diameter semiconductor wafers that are becoming more common.

The examples were also tested for peel adhesion using test method B with various substrates and dwell times and with the results shown below in Table 12.

EXAMPLES 44 to 49

A series of adhesive coated tapes was prepared. In each example the adhesive composition comprised a 28% solids solution of thermoplastic elastomer that was obtained by combining 28% by weight thermoplastic elastomer, 64% by weight toluene, and 8% by weight isopropanol in a one quart glass jar, sealing the jar, and allowing the blend to mix on a roller table for 24 hours until there was no visible evidence of undissolved thermoplastic elastomer. The adhesive composition was then coated onto a 50 µm thick polyethylene terephthalate backing using a draw knife with a bullnose draw bar having approximately a 100 µm coating thickness gap. The adhesive coated film was then dried for 30 minutes at 70° C. to give a dry adhesive thickness of about 20–30 μm. The thermoplastic elastomer was varied as shown below in Table 11.

TABLE 11

| | Thermoplastic Elastomer | | |
|---|---|---|---|
| Example | Trade Name | Type | % Styrene |
| 44 | Kraton D-1113 PX | SIS | 16 |
| 45 | Kraton D-1125 PX | SIS | 30 |
| 46 | Kraton D-1107 P | SIS | 14 |
| 47 | Kraton D-112P-12 | SIS | 14 |
| 48 | Kraton D-1117 P | SIS | 17 |
| 49 | Kraton RP-6912 | SEPSEP | 23 |

The examples were tested for peel adhesion using test method B with various substrates and dwell times as shown below in Table 12 along with the results.

TABLE 12

| | | PEEL ADHESION IN GL1WWAFTER DWELL | | | | |
|---|---|---|---|---|---|---|
| EXAMPLE | SUBSTRATE | 4 HOURS | 1 DAY | 3 DAYS | 15 DAYS | 30 DAYS |
| 38 | Silicon wafer | 19.6 | 37.1 | 65.3 | 67.9 | 70.9 |
| 39 | Silicon wafer | 23.7 | 33.9 | 50.8 | 41.1 | 49.3 |
| 40 | Silicon wafer | 112.7 | 142.3 | 190+ | 158.6 | 169.6 |
| 41 | Silicon wafer | 28.1 | 36.3 | 46.7 | 50.3 | 45.5 |
| 42 | Silicon wafer | 38.8 | 48.7 | 42.2 | 47.2 | 35.4 |
| 43 | Silicon wafer | 63.9 | 190+ | 190+ | 190+ | 190+ |
| 44 | Silicon wafer | 104.9 | 190+ | 190+ | 190+ | 190+ |
| 45 | Silicon wafer | 3.4 | 23.1 | 45.5 | 190+ | 190+ |
| 46 | Silicon wafer | 98.9 | 98.1 | 190+ | 190+ | 190+ |
| 47 | Silicon wafer | 175.3 | 114.7 | 190+ | 190+ | 190+ |
| 48 | Silicon wafer | 31.8 | 190+ | 190+ | 190+ | 190+ |
| 49 | Silicon wafer | 21.5 | 48.0 | 81.0 | 166.1 | 190+ |
| Nitto Denko V-12-S | Silicon wafer | 70.6 | 92.6 | 90.4 | 95.7 | 100 |
| 38 | Glass | 116.4 | 80.1 | 190+ | 122.3 | 150.6 |
| 39 | Glass | 76.7 | 75.7 | 143.2 | 146.2 | 150.1 |
| 40 | Glass | 190+ | 171.3 | 190+ | 190+ | 190+ |
| 41 | Glass | 75.1 | 31 | 36.7 | 74.4 | 130.1 |
| 42 | Glass | 31.2 | 47.6 | 54.9 | 62.8 | 69.9 |
| Nitto Denko V-12-S | Glass | 95.1 | 96.8 | 102.5 | 111.2 | 120.5 |
| 40 | Stainless steel | 91.7 | 140.8 | 129.9 | 157.9 | 143.5 |
| 41 | Stainless steel | 19.5 | 29.1 | 54.2 | 68.4 | 50.9 |
| 42 | Stainless steel | 21.5 | 33.2 | 43.4 | 48.3 | 41.2 |
| 43 | Stainless steel | 61.2 | 78.0 | 190+ | 190+ | 190+ |
| Nitto Denko V-12-S | Stainless steel | 76.1 | 87.6 | 88.4 | 95.5 | 102.5 |

The foregoing data show the ability of the wafer processing tapes of the invention to incorporate relatively thin permanent backings. This can be advantageous in permitting the use of a relatively thicker layer of adhesive which can make it easier to dice semiconductor wafers without cutting into the backing. Also, with thinner backings, the amount of tape that can be wound about a core into roll form can be increased which can reduce the frequency of tape roll changes, thereby increasing manufacturing efficiency.

It would be possible to selectively increase or decrease the adhesion of these examples by the use of adhesion modifiers as discussed above. Preferably, the wafer processing tapes show minimal adhesion build over two weeks, and more preferably over about one month, so as to provide a long shelf life and to eliminate the need to remove the semiconductor IC chips immediately after dicing and store them until actually needed. Though not shown specifically in Table 12, each example of the invention had a storage modulus above the Dahlquist criterion line.

Several of the examples were evaluated using the semiconductor wafer dicing test described above. The results reported below in Table 13 represent the numnber of die washed off the tape during the wafer dicing process.

TABLE 13

| EXAMPLE | DIE LOSS |
|---|---|
| 38 | 29 |
| 39 | 297 |
| 41 | 26 |
| 42 | 83 |
| Nitto Denko V-12-S | 38 |

Table 13 shows that preferred examples of the invention (examples 38 and 41) gave results better than that obtained with the widely used commercially available tape. However, the wafer processing tapes of the invention were easier to work with than the commercially available tape because the tapes of the invention had a thicker layer of adhesive. Thus, the semiconductor wafers could be diced without cutting into the backings used in the tapes of the invention. The semiconductor wafers could not be diced without cutting into the backing of commercially available tape. If the tape backing is cut during wafer dicing, it could fail prematurely. Moreover, even with a thick adhesive layer, the wafer processing tapes of the invention did not leave adhesive residue on the dicing saw blade.

Various modifications and alterations of this invention will become apparent to those skilled in the art without departing from the scope and spirit of the invention. It should be understood that this invention is not limited to the illustrative embodiments set forth herein.

What is claimed is:

1. A semiconductor wafer processing tape comprising a permanent backing and a layer of a non-pressure sensitive adhesive comprising a thermoplastic elastomer block copolymer on the permanent backing, wherein the adhesive has a storage modulus at room temperature greater than $3 \times 10^5$ Pascals and wherein the tape attaches to a surface of a semiconductor wafer under ambient conditions.

2. A semiconductor wafer processing tape according to claim 1 wherein the storage modulus of the adhesive composition at room temperature is greater than $1 \times 10^6$ Pascals.

3. A semiconductor wafer processing tape according to claim 1 wherein the thermoplastic elastomer block copolymer comprises 15 to 25% by weight styrene.

4. A semiconductor wafer processing tape according to claim 1 wherein the thermoplastic elastomer block copolymer is a styrene-ethylene/propylene-styrene block copolymer.

5. A semiconductor wafer processing tape according to claim 1 wherein the thermoplastic elastomer block copolymer is a styrene-ethylene/propylene-styrene-ethylene/propylene block copolymer.

6. A semiconductor wafer processing tape according to claim 1 wherein the adhesive further comprises a tackifying resin.

7. A semiconductor wafer processing tape according to claim 6 wherein the tackifing resin is present in an amount of less than 10% by weight, based on the combined weight of the thermoplastic elastomer block copolymer and tackifying resin.

8. A semiconductor wafer processing tape according to claim 7 wherein the tackifying resin is present in an amount of about 3 to 8% by weight, based on the combined weight of the thermoplastic elastomer block copolymer and tackifying resin.

9. A semiconductor wafer processing tape according to claim 1 wherein the adhesive further comprises a liquid rubber.

10. A semiconductor wafer processing tape according to claim 9 wherein the liquid rubber is present in an amount of less than 20% by weight, based on the combined weight of the thermoplastic elastomer block copolymer and the liquid rubber.

11. A semiconductor wafer processing tape according to claim 10 wherein the liquid rubber is present in an amount of about 5% to less than 20% by weight, based on the combined weight of the thermoplastic elastomer block copolymer and the liquid rubber.

12. A semiconductor wafer processing tape according to claim 1 further comprising a primer for bonding the adhesive to the permanent backing.

13. A semiconductor wafer processing tape according to claim 1 further comprising a temporary and removable protective liner on the exposed layer of adhesive.

14. A semiconductor wafer processing tape according to claim 13 wherein the temporary and removable protective liner is a polyester film that does not include a release agent.

15. A semiconductor wafer processing tape according to claim 1 further comprising a semiconductor wafer on the exposed layer of adhesive.

16. A semiconductor wafer processing tape according to claim 1 wherein the tape exhibits a peel adhesion of about 20 to 500 grams per linear inch width to a substrate selected from the group consisting of silicon, polyimide, silicon oxynitride passivation layer, and photoresist coatings.

17. A semiconductor wafer processing tape according to claim 16 wherein the tape exhibits a peel adhesion of about 20 to 200 grams per linear inch width to a substrate selected from the group consisting of silicon, integrated circuit polyimide passivation layer, silicon oxynitride passivation layer, and photoresist coatings.

18. A semiconductor wafer processing tape according to claim 16 wherein the tape exhibits a peel adhesion of about 20 to 500 grams per linear inch width after dwelling in contact with said substrate for at least 7 days under ambient conditions.

19. A semiconductor wafer processing tape according to claim 17 wherein the tape exhibits a peel adhesion of about 20 to 200 grams per linear inch width after dwelling in contact with said substrate for at least 7 days under ambient conditions.

20. A semiconductor wafer processing tape comprising a permanent backing and a layer of a non-pressure sensitive adhesive on the permanent backing, wherein the adhesive comprises a hydrogenated thermoplastic elastomer block copolymer, and an adhesion modifier selected from the group consisting of tackifying resin, liquid rubber, and a photocrosslinking agent, wherein the adhesive has a storage modulus at room temperature greater than $3 \times 10^5$ Pascals and wherein the tape attaches to a surface of a semiconductor wafer under ambient conditions.

21. A semiconductor wafer processing tape according to claim 20 wherein the adhesion modifier is a tackifying resin present in an amount of about 3 to 8% by weight, based on the combined weight of the hydrogenated thermoplastic elastomer block copolymer and the tackifying resin.

22. A semiconductor wafer processing tape according to claim 20 wherein the adhesion modifier is a liquid rubber present in an amount of about 5% to less than 20% by weight, based on the combined weight of the hydrogenated thermoplastic elastomer block copolymer and the liquid rubber.

23. A semiconductor wafer processing tape according to claim 20 wherein the tape exhibits a peel adhesion of about 20 to 200 grams per linear inch width to a substrate selected from the group consisting of silicon, integrated circuit polyimide passivation layer, silicon oxynitride passivation layer, and photoresist coatings.

24. A semiconductor wafer processing tape according to claim 23 wherein the tape exhibits a peel adhesion of about 20 to 200 grams per linear inch width after dwelling in contact with said substrate for at least 7 days under ambient conditions.

25. A semiconductor wafer processing tape comprising a permanent backing and a layer of a non-pressure sensitive adhesive on the permanent backing, wherein the adhesive comprises a thermoplastic elastomer block copolymer and a photocrosslinking agent, wherein the adhesive has a storage modulus at room temperature greater than $3 \times 10^5$ Pascals, and wherein the tape attaches to a surface of a semiconductor wafer under ambient conditions.

26. A semiconductor wafer processing tape according to claim 25 wherein the tape exhibits a peel adhesion of about 20 to 200 grams per linear inch width to a substrate selected from the group consisting of silicon, integrated circuit polyimide passivation layer, silicon oxynitride passivation layer, and photoresist coatings.

27. A semiconductor wafer processing tape according to claim 26 wherein the tape exhibits a peel adhesion of about 20 to 200 grams per linear inch width after dwelling in contact with said substrate for at least 7 days under ambient conditions.

28. A semiconductor wafer processing tape comprising a permanent backing and a layer of a non-pressure sensitive on a permanent backing, wherein the adhesive comprises a hydrogenated thermoplastic elastomer block copolymer that displays a storage modulus at 20 C. of $2.7 \times 10^6$ Pascals to $4.0 \times 10^6$ Pascals and wherein the tape attaches to a surface of a semiconductor wafer under ambient conditions.

29. A semiconductor wafer processing tape according to claim 28 wherein the hydrogenated thermoplastic elastomer block copolymer is a styrene-ethylene/propylene-styrene block copolymer.

30. A semiconductor wafer processing tape according to claim 28 wherein the hydrogenated thermoplastic elastomer block copolymer is a styrene-ethylene/propylene-styrene-ethylene/propylene block copolymer.

31. A semiconductor wafer processing tape comprising a permanent backing and a layer of a non-pressure sensitive adhesive on the permanent backing, wherein the adhesive has a storage modulus at room temperature greater than $1 \times 10^6$ Pascals and comprises a thermoplastic elastomer block copolymer, and further wherein the tape exhibits a peel adhesion of about 20 to 500 grams per linear inch width to a substrate selected from the group consisting of silicon, polyimide, silicon oxynitride passivation layer, and photoresist coatings both at the time of applying the tape to the substrate and after dwelling in contact with the substrate for at least 7 days under ambient conditions.

32. A semiconductor wafer processing tape according to claim 31 further comprising an adhesion modifier selected from the group consisting of tackifying resin, liquid rubber and photocrosslinking agent.

33. A semiconductor wafer processing tape according to claim 31 wherein the thermoplastic elastomner block copolymer comprises blocks of styrene and ethylene/propylene.

34. A semiconductor wafer dicing tape comprising a permanent backing and a layer of a non-pressure sensitive adhesive on the permanent backing, wherein the adhesive has a storage modulus at room temperature greater than $1 \times 10^6$ Pascals and comprises a thermoplastic elastomer block copolymer, and further wherein the tape exhibits a peel adhesion of about 20 to 200 grams per linear inch width to the silicon surface of a semiconductor wafer both at the time of applying the tape and after dwelling in contact with the substrate for at least 7 days under ambient conditions.

35. A semiconductor wafer dicing tape according to claim 34 wherein the peel adhesion at the time of applying the tape to the substrate and after dwelling in contact with the substrate for at least 15 days under ambient conditions is about 20 to 200 grams per linear inch width.

36. A semiconductor wafer dicing tape according to claim 26 wherein the permanent backing has a thickness of about 12 to 25 µm.

37. A semiconductor wafer dicing tape according to claim 26 wherein the permanent backing has an elongation at break of about 120 to 165% in the machine direction.

* * * * *

UNITED STATES PATENT AND TRADEMARK OFFICE
CERTIFICATE OF CORRECTION

PATENT NO.: 5,851,664
DATED: December 22, 1998
INVENTOR(S): Richard E. Bennett, Gerald C. Bird, Mark K. Nestegard, and Eleanor Rudin It is certified that error appears in the above-identified patent and that said Letters Patent is hereby corrected as shown below:

Front page, under "Foreign patent Documents", the following should be added --WO 94/21742 9/1994 WIPO--.

Signed and Sealed this

Seventeenth Day of April, 2001

*Attest:*

NICHOLAS P. GODICI

*Attesting Officer*      Acting Director of the United States Patent and Trademark Office